United States Patent
Young

[19]

[11] Patent Number: 5,962,881
[45] Date of Patent: Oct. 5, 1999

[54] FPGA LAYOUT FOR A PAIR OF SIX INPUT MULTIPLEXERS

[75] Inventor: Steven P. Young, San Jose, Calif.

[73] Assignee: Xilinx, Inc., San Jose, Calif.

[21] Appl. No.: 09/023,255

[22] Filed: Feb. 13, 1998

Related U.S. Application Data

[62] Division of application No. 08/635,096, Apr. 17, 1996, Pat. No. 5,744,995.

[51] Int. Cl.⁶ .................................................. H01L 27/10
[52] U.S. Cl. ........................... 257/208; 257/202; 257/203
[58] Field of Search ................................... 257/202, 203, 257/208

[56] References Cited

U.S. PATENT DOCUMENTS

| | | | |
|---|---|---|---|
| 3,614,327 | 10/1971 | Low | 327/408 |
| 4,551,634 | 11/1985 | Takahashi et al. | 327/408 |
| 4,692,634 | 9/1987 | Fang et al. | 327/408 |
| 5,030,861 | 7/1991 | Hoffmann et al. | 327/410 |
| 5,214,299 | 5/1993 | Gal et al. | 257/208 |
| 5,416,367 | 5/1995 | Chan et al. | 326/44 |
| 5,418,480 | 5/1995 | Hastie et al. | 327/408 |
| 5,436,574 | 7/1995 | Veenstra | 327/407 |
| 5,438,295 | 8/1995 | Reddy et al. | 327/408 |
| 5,570,051 | 10/1996 | Chiang et al. | 327/407 |
| 5,691,218 | 11/1997 | Colwell et al. | 437/48 |
| 5,861,641 | 1/1999 | Yoeli et al. | 257/211 |

*Primary Examiner*—Sara Crane
*Attorney, Agent, or Firm*—Edel M. Young

[57] ABSTRACT

A six-input multiplexer is disclosed using only two transistors in the signal path from an input port to the output port. The multiplexer uses control signals that are not decoded. The multiplexer uses three control signals and requires that the control signal combinations 000 and 111 not be used. The other six control signal combinations 001, 010, 011, 100, 101, and 110 can be used to select between six input signals by placing only two transistors in the signal path, taking advantage of the fact that two of the three control signals are the same and the third is different from the other two. A compact layout results when two multiplexers use common input signals.

10 Claims, 7 Drawing Sheets

FPGA LAYOUT FOR A PAIR OF SIX INPUT MULTIPLEXERS

CROSS-REFERENCE TO RELATED APPLICATIONS

This application is a divisional application of commonly assigned application Ser. No. 08/635,096, now U.S. Pat. No. 5,744,995 invented by Steven P. Young and filed Apr. 17, 1996, which is incorporated herein by reference.

FIELD OF THE INVENTION

The invention relates to integrated circuits, more particularly to multiplexers implemented in integrated circuit devices.

BACKGROUND OF THE INVENTION

In the field of integrated circuit devices, particularly programmable devices, it is desirable to move a signal as fast as possible along its path to a destination. It is also desirable to minimize the area of an integrated circuit device needed to implement a function. Thus speed should be maximized and area should be minimized. In the case of multiplexers, memory cells are frequently used to control a multiplexer. It is widely known that two memory cells can select between up to four input signals and three memory cells can select between up to eight input signals.

FIGS. 1–3 show three prior art structures for controlling six-input multiplexers. In FIG. 1, the selection is done by providing a transistors tree, each memory cell selecting a branch of the tree. Memory cell M1 controls N-channel transistors T1, T3, and T5 from its inverting output and transistors T2, T4, and T6 from its noninverting output. A logical 0 in memory cell M1 causes transistors T1, T3, and T5 on and thus forwards input signals IN0, IN2, and IN4 to the next level. Memory cell M2 selects between transistors T7 and T8. If memory cell M2 holds a logical 0, the signal from one of IN0 and IN1 is forwarded to the next level and if memory cell M2 holds a logical 1, the signal from one of IN2 and IN3 is forwarded to the next level. Finally, memory cell M3 controls transistors T9 and T10, and selects between the signal forwarded from one of IN0 through IN3 and the signal forwarded from one of IN4 and IN5. In this embodiment, a signal on IN0 must pass through three transistors, T1, T7, and T9 to reach the OUT terminal. Thus the signal path is slower than desirable.

Alternatively, in FIG. 2, the selection is done by providing one decoder for each input line and turning on a different transistor to enable a different input signal in response to a different combination of signals from the memory cells. For example, AND-gate decoder D1 provides a high output signal when all three of memory cells M1–M3 hold logical 0, turning on transistor T21 and providing the signal on IN0 to OUT. Other memory cell combinations provide one of the other input signals IN0–IN5 as the output signal. Only one transistor is in the signal path, but the control signal must pass through a decoder, and silicon area must be used to provide the decoders. Thus the structure of FIG. 2 is faster but larger than the structure of FIG. 1.

FIG. 3 shows a six-input multiplexer that uses four memory cells and requires the input signal to pass through two transistors to reach the output terminal. Memory cells M1–M3 each select one signal from each of two sets of three input signals. Only one of memory cells M1 through M3 is permitted to hold a logical 1 at one time. When memory cell M1 holds logical 1, it turns on transistors T31 and T34. A logical 1 in memory cell M2 turns on transistors T32 and T35. A logical 1 in memory cell M3 turns on transistors T33 and T36. Memory cell M4 chooses which of the selected input signals is provided to the OUT terminal. This prior art multiplexer places two transistors into each signal path. It uses no decoders, but requires four memory cells.

Other multiplexers are also known. For example, six memory cells can select between six input signals placing only one transistor into the signal path. Three memory cells can control an 8:1 multiplexer with only one transistor in the signal path using decode logic, but this decode logic typically takes more area than an additional memory cell. Larger multiplexers can be formed by combining structures similar to those shown in FIGS. 1–3.

It has not been known in the past that a six input multiplexer can be provided without decoders to select between more than four input signals using only two transistors in a signal path.

SUMMARY OF THE INVENTION

The present invention controls a multiplexer from an odd number of signal sources, for example memory cells, and places into the signal path a number of pass devices equal to (n+1)/2 where n is the number of signal sources. The number of inputs available is 6 for three signal sources and 20 for five signal sources.

In one embodiment, the invention results in a six-input multiplexer using only two transistors in the signal path from an input port to the output port. The multiplexer uses three control signals and requires that the control signal combinations 000 and 111 not be used. The other six control signal combinations 001, 010, 011, 100, 101, and 110 can be used to select between six input signals by placing only two transistors in the signal path, taking advantage of the fact that two of the three control signals are the same and the third is different from the other two. A transistor that would be controlled by the signal known to be different is not placed into the signal path. For example, on the signal path identified by the signal combination 001, N-channel transistors controlled by the complement of the first and second signals are placed in the path. These transistors turn on when the first two signals are 00. Since the third signal is known to be 1 (because the value 000 is not allowed), no transistor is used to indicate the third signal. For another example, on the signal path identified by the signal combination 011, N-channel transistors controlled by the noninverted values of the second and third signals are placed in the path. These transistors turn on when the second and third signals are 11. Six paths respond to six different combinations of the three control signals.

The resulting structure is both small and fast, even when the control signals are switching, because no logic gates are needed to decode the control signals. And using only two transistors rather than three in the signal path makes this path faster than structures having three transistors in the signal path.

The above description refers to transistors connecting portions of a path from an input port to an output port. Transmission gates may alternatively be used.

The above description also relates to a six-input multiplexer. Other numbers of inputs may also be used. In particular, a 20-input multiplexer with three pass devices in each path and five control memory cells can be formed according to the invention, requiring that 2 or 3 0's be present in the five memory cells.

Layout of the multiplexer structure benefits from shared source and drain wells and from the fact that two gates (for the six-input multiplexer) may be placed in series without allowing space for a contact to the conductor extending between the two gates. Also, two paths which connect to the same output terminal may use the same well for the output signal.

In an even more efficient layout, two multiplexers which share input signals may be laid out even more efficiently by alternating gates of the two multiplexers so that input signal wells are also shared.

BRIEF DESCRIPTION ON THE DRAWINGS

DETAILED DESCRIPTION OF THE DRAWINGS

Figure 1:
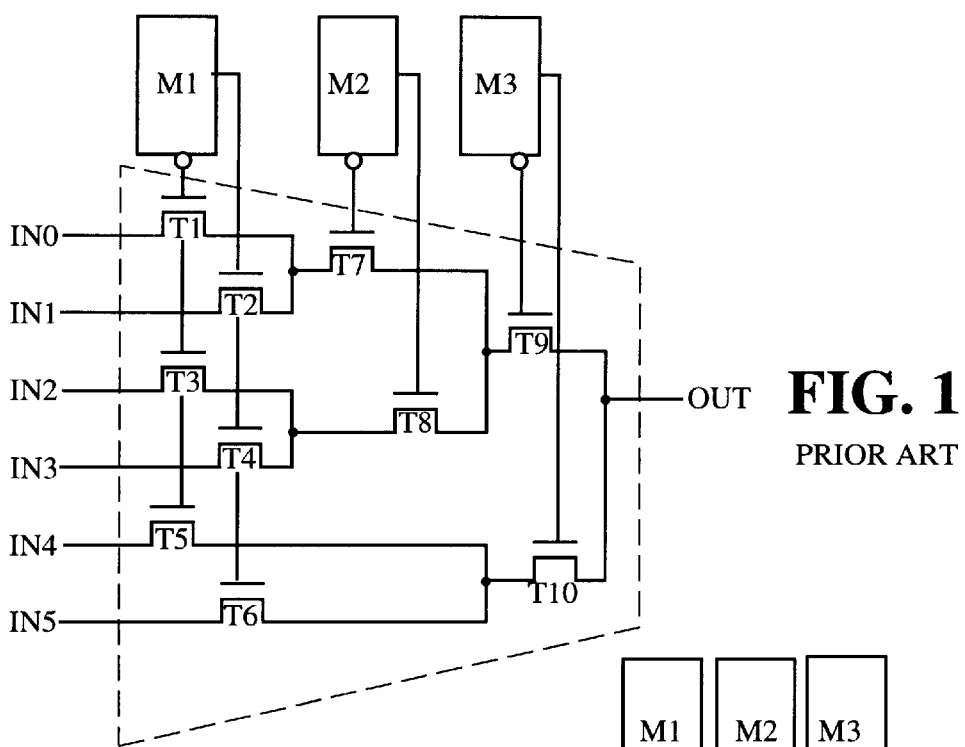
FIGS. 1–3 show three prior art structures for controlling six-input multiplexers.
Figure 2:
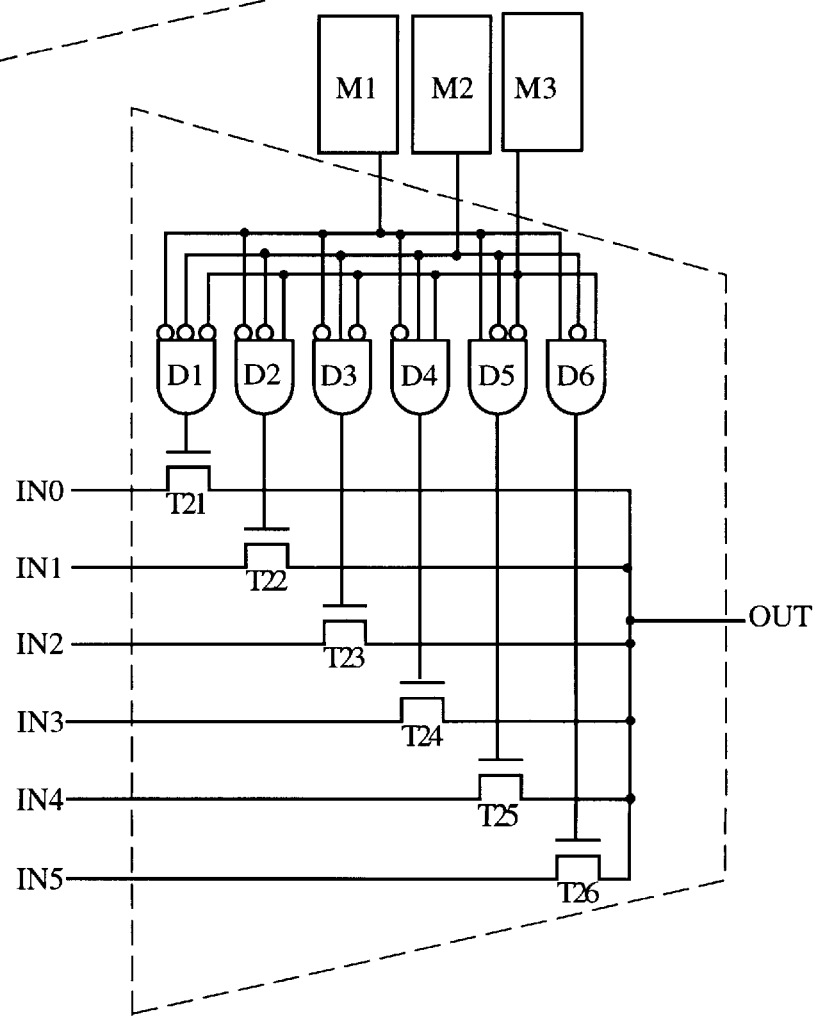
Figure 3:
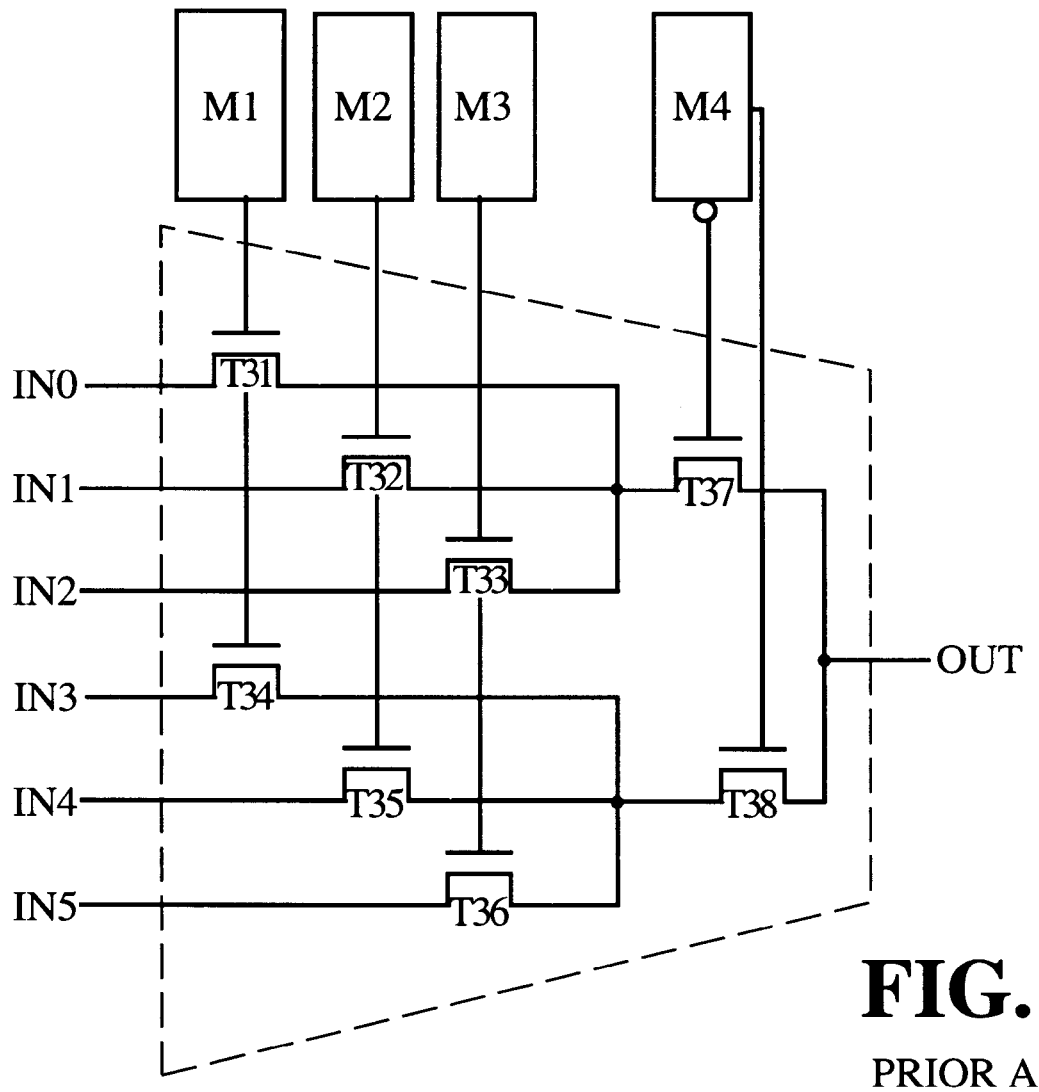
Figure 4:
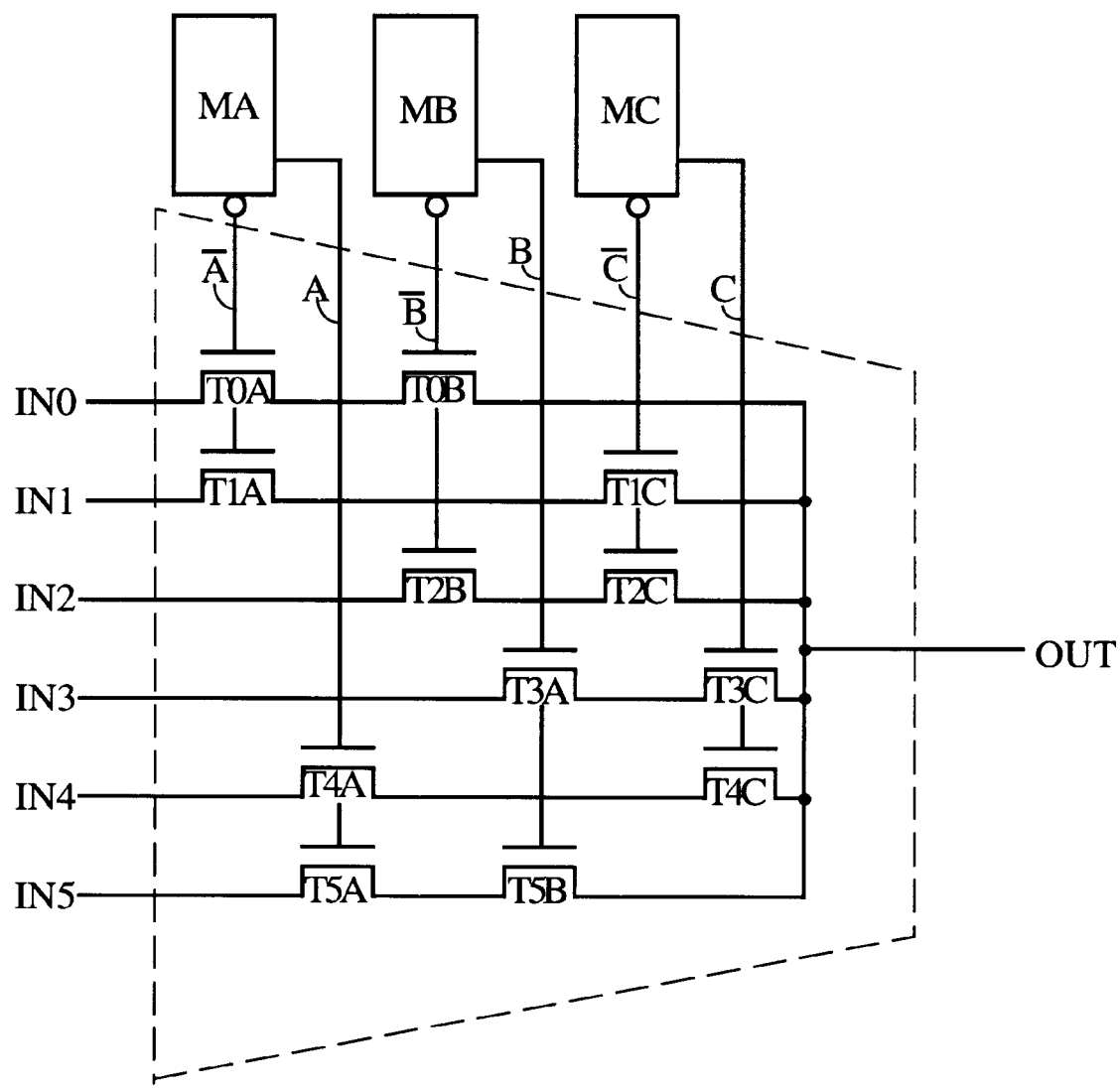
FIG. 4 shows a circuit diagram of a 6-input multiplexer according to the invention.

FIG. 4 shows a circuit diagram of a 6-input multiplexer according to the invention. In FIG. 4, three memory cells, MA, MB, and MC provide the multiplexer control signals. It is not necessary according to the invention that the control signals come from memory cells. The invention also works with switching control signals. However, both the control signals and their complements must be available or made available in order to control the circuit.

In the embodiment of FIG. 4, the inverted outputs of memory cells MA and MB are applied on lines $\overline{A}$ and $\overline{B}$ to the gates of transistors T0A and T0B and thus control whether input line IN0 is connected to OUT. The inverted outputs of memory cells MA and MC determine whether input line IN1 is connected to OUT. The inverted outputs of memory cells MB and MC control whether IN2 is connected to OUT. The noninverted outputs of memory cells MB and MC control whether IN3 is connected to OUT. The noninverted outputs of memory cells MA and MC control whether IN4 is connected to OUT. Finally, the noninverted outputs of memory cells MA and MB control whether IN5 is connected to OUT. Memory cell combinations of 000 and 111 are not allowed since they would cause multiple inputs to be selected. With this combination of transistors and control signals, only one input line will be connected to the output line at any one time, and the following truth table results:

| A | B | C | OUT |
|---|---|---|---|
| 0 | 0 | 0 | Not allowed |
| 0 | 0 | 1 | IN0 |
| 0 | 1 | 0 | IN1 |
| 0 | 1 | 1 | IN2 |
| 1 | 0 | 0 | IN3 |
| 1 | 0 | 1 | IN4 |
| 1 | 1 | 0 | IN5 |
| 1 | 1 | 1 | Not allowed |

Other combinations similar to FIG. 4 and the above truth table can also be prepared using the principles of the invention. The invention has been described as controlling transistors in the signal path to turn on only when a particular pair of control signals matches. The equivalent result would occur if a value in one of the memory cells was inverted and the connections from that memory cell's output leads were also inverted. And, of course, naming of the input signals and positioning of the six input paths can be different from that shown.

Layout

Since a goal of the invention is to minimize area, the layout of the resulting structure is also considered.

Figure 5:
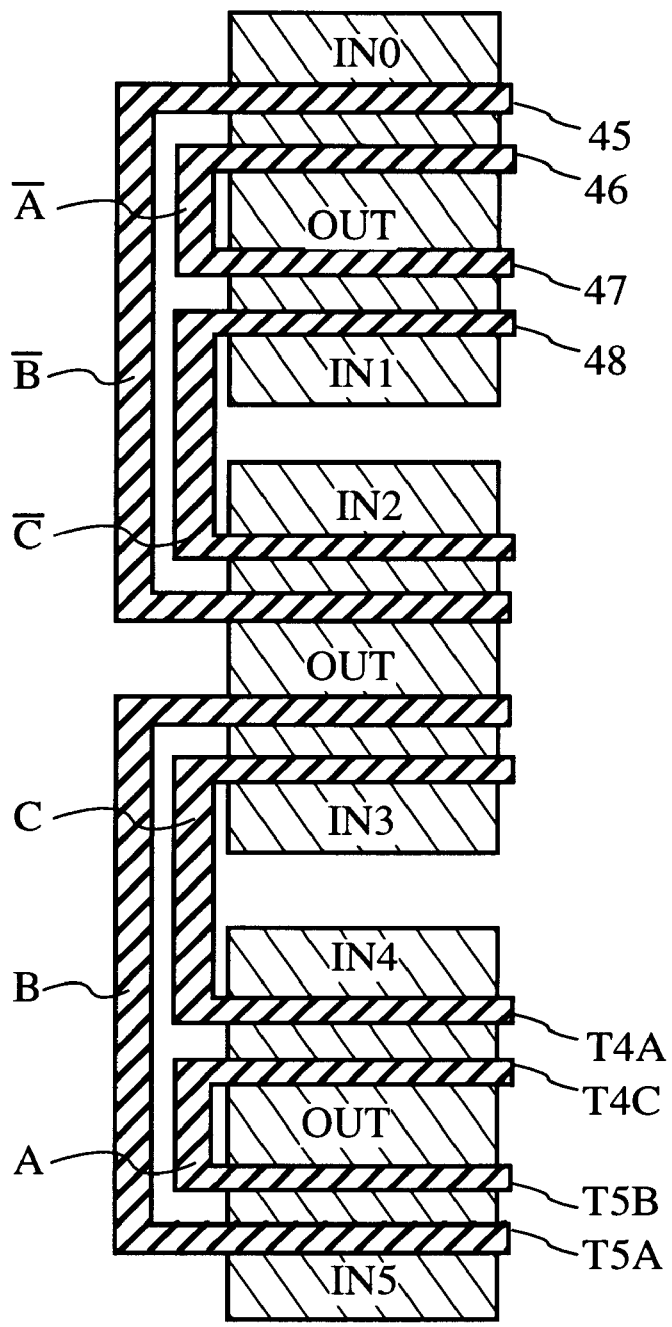
FIG. 5 is a plan view indicating the physical relationship of the elements in the circuit of FIG. 4.

FIG. 5 shows a general layout map of the structure. FIG. 5 is a plan view indicating the physical relationship of the elements in the circuit of FIG. 4. Source and drain wells are indicated by shading lines leaning to the left and poly gates are indicated by shading lines leaning right. Three wells are labeled OUT and are connected together by metal lines, not shown, to provide the output signal OUT shown in FIG. 4. The six input signals IN0 through IN5 are connected through metal vias, not shown, to the six wells labeled IN0 through IN5 in FIG. 5. Also labeled in both FIG. 4 and FIG. 5 are transistors T4A, T4C, T5B, and T5A. Poly regions A, B, C, $\overline{A}$, $\overline{B}$, and $\overline{C}$ are labeled to correspond to lines of the same label in FIG. 4 which connect memory cells M1–M3 to transistor gates. Thus the labels allow the reader to determine the correspondence between the circuit diagram of FIG. 4 and the layout diagram of FIG. 5.

As can be seen in FIG. 5, it is possible to place two transistor gates on the same signal path closer together when no space is needed for metal contacts. For example two gates 45 and 46 are positioned between the input signal well IN0 and one of the output signal wells OUT. Similarly, two gates 47 and 48 are placed between input signal well IN1 and this same output signal well OUT. The space between transistors 45 and 46 is able to be smaller than the space which must be allowed for IN0 or OUT because no contact region must be provided between region IN0 and OUT.

Four transistors are shown in FIG. 5. The transistor gate regions, labeled T4A, T4C, T5B, and T5A correspond to transistors of the same labels in FIG. 4. Poly regions A, B, and C in FIG. 5 correspond to lines A, B, and C in FIG. 4. This layout requires small area because of the advantageous placement of poly regions for connecting together two gates to be controlled by the same signal. This layout also requires a small silicon area because no contact must be placed between gates 45 and 46 or between gates 47 and 48. Also area is saved by the sharing of the OUT regions with two sets of transistors.

Application

Figure 6:
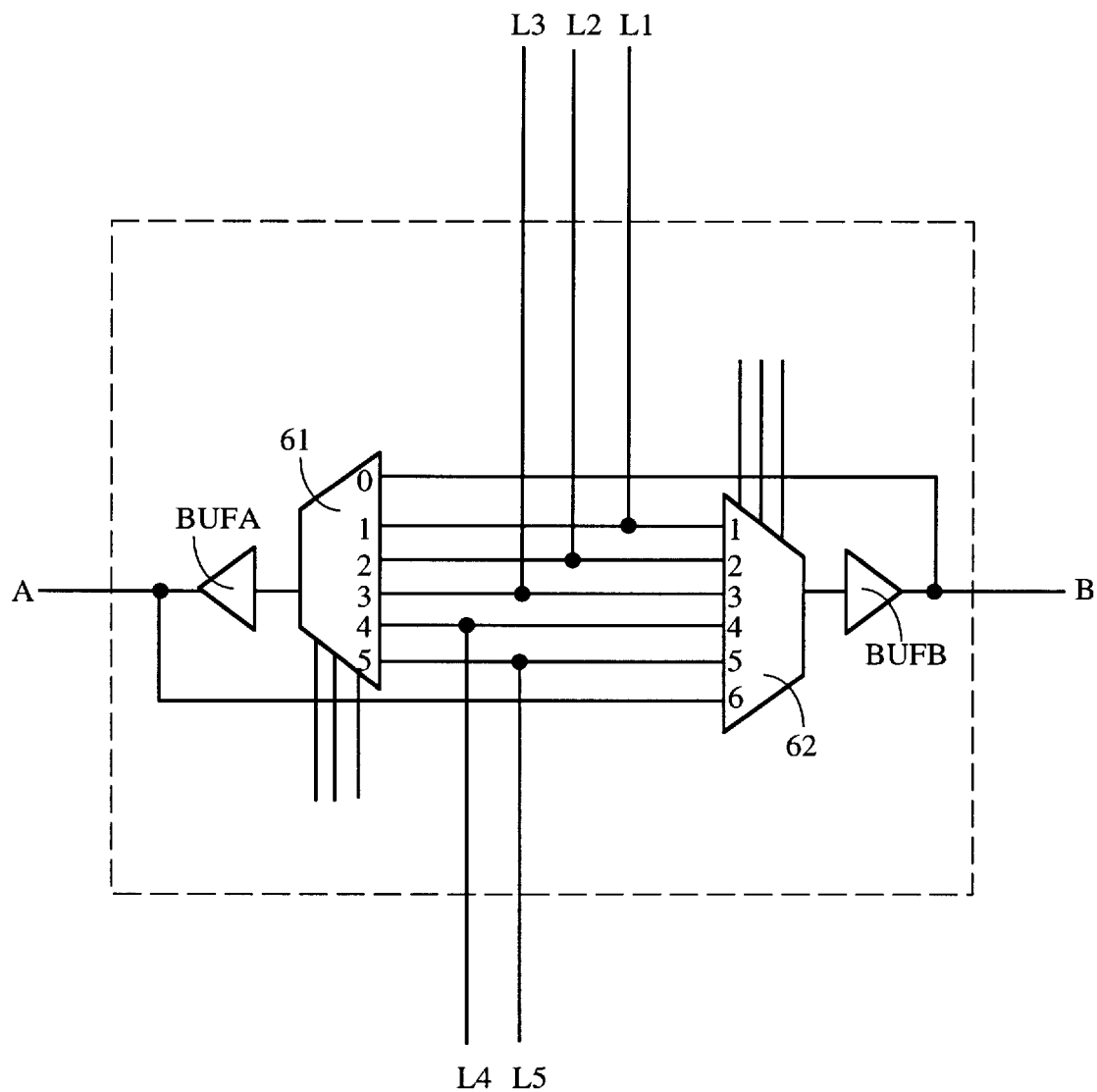
FIG. 6 shows an interconnection structure in an FPGA with two interconnect multiplexers in which most multiplexer input signals are shared but which are controlled separately.

In some applications, it is desirable to provide two multiplexers which are controlled separately but in which most input signals are shared. FIG. 6 shows an interconnection structure in an FPGA for which this is the case. This interconnection structure selectively connects several interconnect lines to lines A and B and also selectively connects A and B to each other through a bidirectional buffer. The bidirectional buffer comprises two buffers BUFA and BUFB which are controlled to drive signals onto line A and line B, respectively. (Buffers BUFA and BUFB may be either always on or tristate buffers.) Multiplexer 61 can be programmed to apply any of the signals from lines L1 through L5 and line B to buffer BUFA, which buffers the selected signal and applies it to line A. Likewise, multiplexer 62 can be programmed to apply any of the signals from lines L1 through L5 and line A to buffer BUFB, which buffers the selected signal and applies it to line B. Thus five of the six input signals to multiplexers 61 and 62 are the same.

Figure 7:
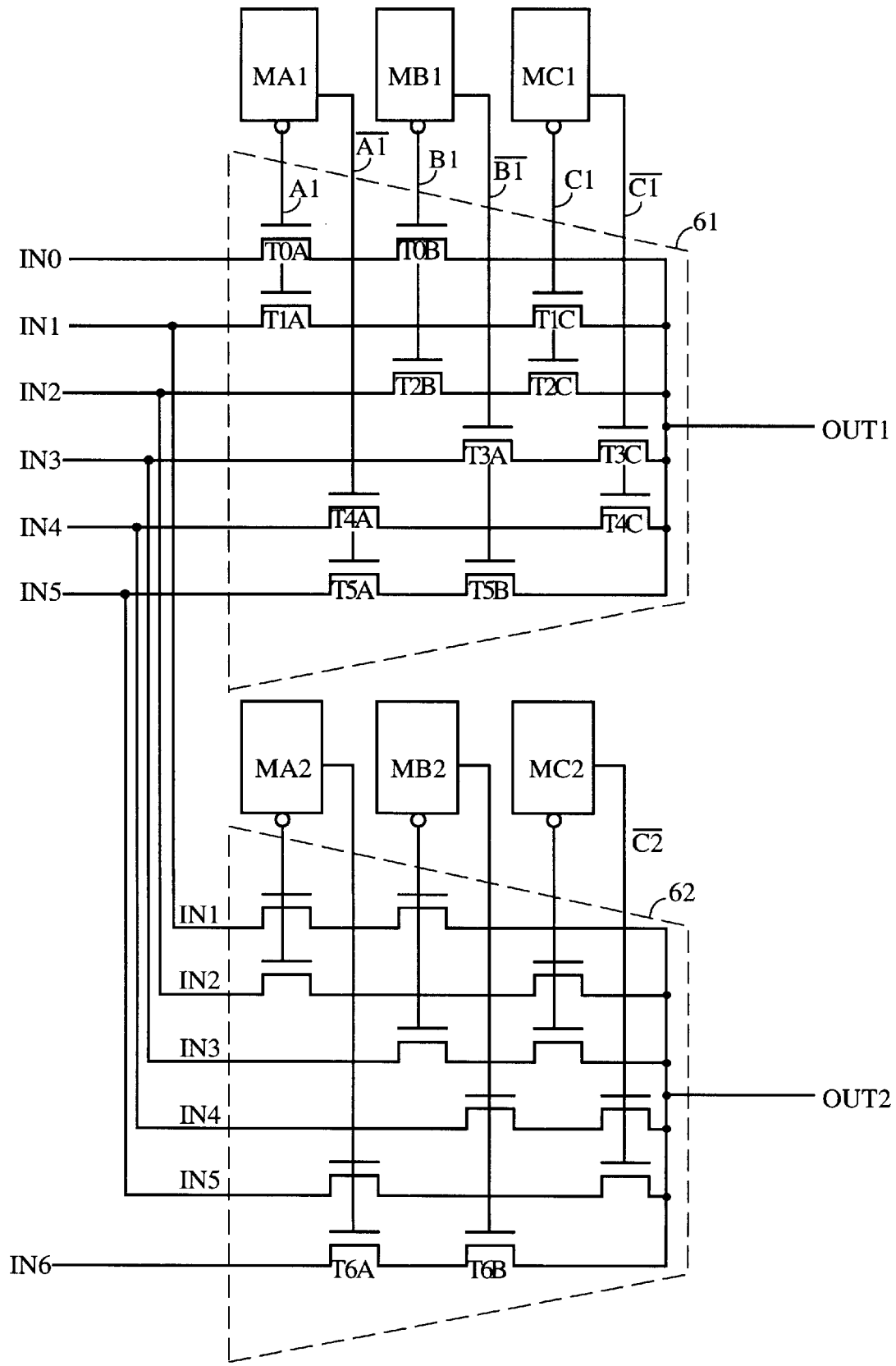
FIG. 7 shows a circuit in which the two multiplexers 61 and 62 share five of their six input signals.

The layout is even more efficient when two multiplexers share input signals. FIG. 7 shows a circuit in which the two multiplexers 61 and 62 share five of their six input signals. Multiplexer 61 generates the signal OUT1 and multiplexer 62 generates the output signal OUT2. Input signal IN0 is used only by multiplexer 61 and input signal IN6 is used only by multiplexer 62. The structure and transistor arrangement in multiplexer 61 is the same as that in FIG. 4. Thus the transistors have the same labels. Multiplexer 62 also has the same arrangement. Only transistors T6A and T6B for controlling the connection of input signal IN6 to OUT2 are labeled. The two multiplexers are separately controlled. Multiplexer 61 is controlled by lines A1, B1, C1, $\overline{A1}$, $\overline{B1}$ and $\overline{C1}$ from memory cells MA1, MB1, and MC1 in a manner analogus to the control of the multiplexer of FIG. 4. Multiplexer 62 is controlled by memory cells MA2, MB2, and MC2. As in the discussion of FIG. 4, neither set of memory cells may hold the combinations 000 or 111. (Of course, the two signals IN0 and IN6 may also be the same signal.)

Figure 8:
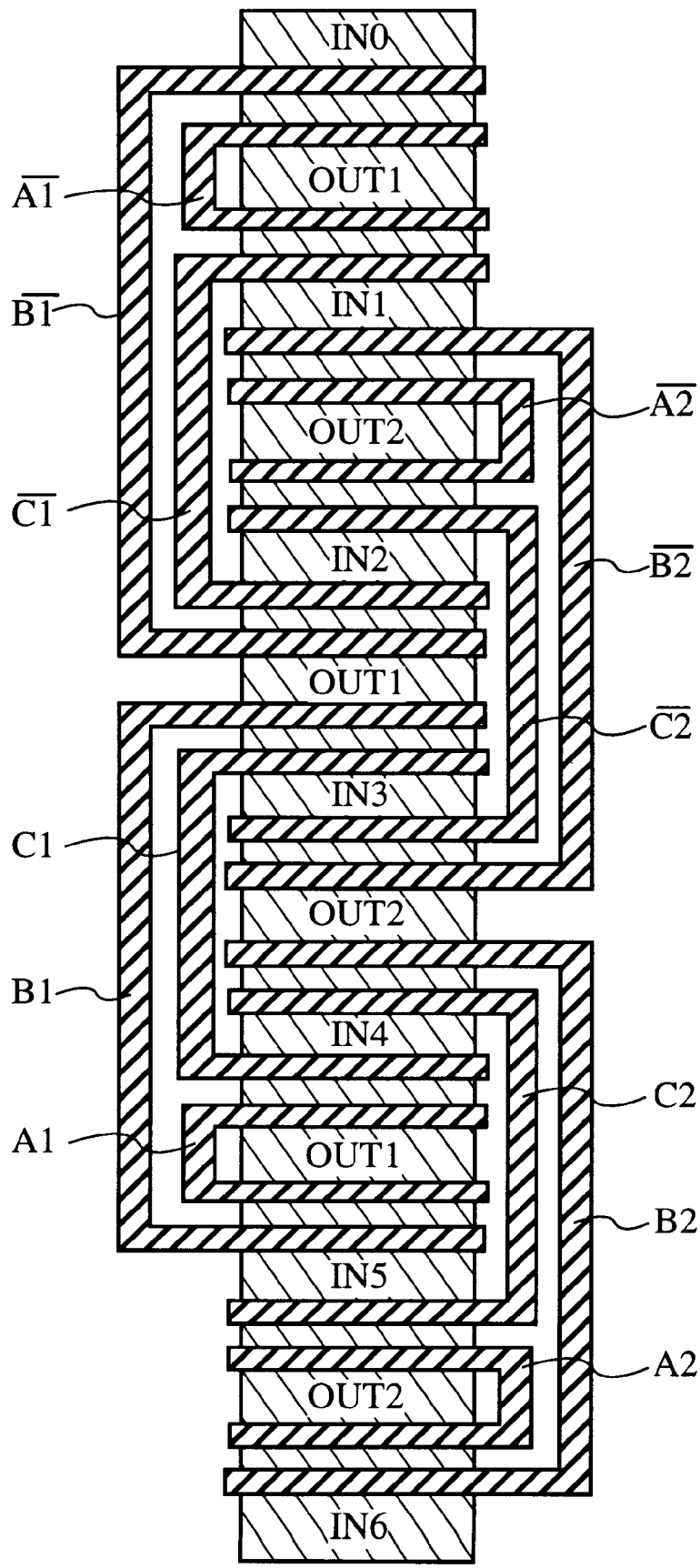
FIG. 8 shows a layout of the structure of FIG. 7.

FIG. 8 shows a particularly efficient layout of this structure. The layout of FIG. 8 is particularly compact because of the shared wells for both input and output terminals. A comparison of FIGS. 5 and 8 shows that the second multiplexer can be had for an area increase of less than 50%. The control lines A1, B1, C1, $\overline{A1}$, $\overline{B1}$ and $\overline{C1}$ are partly formed in poly, as shown, and have a comb shape with the comb spine to the left of the transistor region and teeth extending to the right to form transistor gates. Interspersed between gate pairs of multiplexer 61 are control lines A2, B2, C2, $\overline{A2}$, $\overline{B2}$ and $\overline{C2}$ of multiplexer 62, which also have a comb shape with the comb spine to the right of the transistor region and teeth extending to the left to form transistor gates. Positioned to the left of FIG. 8, but not shown, are memory cells MA1, MB1, and MC1. Positioned to the right of FIG. 8 (not shown) are memory cells MA2, MB2, and MC2. Metal lines, also not shown, connect appropriate points in the memory cells to the poly gates. To minimize resistance, multiple metal contacts to a single poly region may be used.

Larger Devices

The principles described above also apply to a 20-input multiplexer, controlled by five memory cells A, B, C, D, and E. Of the 32 possible combinations of values, only those having two or three 0's are allowed. Thus the following 20 combinations can be applied to five memory cells A, B, C, D, and E to select between 20 input signals.

|    | A | B | C | D | E |
|----|---|---|---|---|---|
| 1  | 0 | 0 | 0 | 1 | 1 |
| 2  | 0 | 0 | 1 | 0 | 1 |
| 3  | 0 | 0 | 1 | 1 | 0 |
| 4  | 0 | 0 | 1 | 1 | 1 |
| 5  | 0 | 1 | 0 | 0 | 1 |
| 6  | 0 | 1 | 0 | 1 | 0 |
| 7  | 0 | 1 | 0 | 1 | 1 |
| 8  | 0 | 1 | 1 | 0 | 0 |
| 9  | 0 | 1 | 1 | 0 | 1 |
| 10 | 0 | 1 | 1 | 1 | 0 |
| 11 | 1 | 0 | 0 | 0 | 1 |
| 12 | 1 | 0 | 0 | 1 | 0 |
| 13 | 1 | 0 | 0 | 1 | 1 |
| 14 | 1 | 0 | 1 | 0 | 0 |
| 15 | 1 | 0 | 1 | 0 | 1 |
| 16 | 1 | 0 | 1 | 1 | 0 |

-continued

|    | A | B | C | D | E |
|----|---|---|---|---|---|
| 17 | 1 | 1 | 0 | 0 | 0 |
| 18 | 1 | 1 | 0 | 0 | 1 |
| 19 | 1 | 1 | 0 | 1 | 0 |
| 20 | 1 | 1 | 1 | 0 | 0 |

If three of the like values are looked at, then the other two must be different, and they don't have to be looked at. Thus a multiplexer can be constructed in which each signal path includes only three transistors. From the above list, the first path includes transistors controlled by the inverted outputs of the left-most memory cells A, B, and C. This first path will be enabled when these left-most memory cells carry logic 0. The second path is enabled by transistors connected to the inverting outputs of memory cells A, B, and D. The fourth path is enabled by the noninverting outputs of memory cells C, D, and E. The general rule is that when a path is enabled by three 0's and two 1's, the three 0's are looked at and the inverting memory cell outputs are used to control the three transistors in the path. When a path is enabled by two 0's and three 1's, the three 1's are looked at and the noninverting memory cell outputs are used.

Other numbers of multiplexer inputs may also be accommodated. A six-input multiplexer can also accommodate five inputs. A 20-input multiplexer can also accommodate fewer inputs. Such variations are intended to fall within the scope of the claims.

What is claimed is:

1. A multiplexer layout in an integrated circuit device, comprising:
   a semiconductor substrate including:
      a plurality of input regions;
      a plurality of conductive regions;
      a plurality of output regions; and
      a plurality of channel regions;
   a plurality of gates each formed above one of said channel regions;
   said input regions, output regions, and gates being arranged generally in the following sequence as seen from above the integrated circuit device: a first input region, a first gate, a first conductive region, a second gate, an output region, a third gate, a second conductive region, a fourth gate, and a second input region.

2. The multiplexer layout of claim 1, wherein said second gate and said third gate are connected.

3. The multiplexer layout of claim 2, wherein said second gate and said third gate are connected through a polysilicon layer.

4. The multiplexer layout of claim 1, wherein at least two of said plurality of gates are connected.

5. The multiplexer layout of claim 4, wherein at least two of said plurality of gates are connected through a polysilicon layer.

6. A multiplexer layout in an integrated circuit device, comprising:
   a semiconductor substrate including:
      a plurality of input regions;
      a plurality of conductive regions;
      a plurality of output regions including a first output region serving a first multiplexer and a second output region serving a second multiplexer; and
      a plurality of channel regions;
   a plurality of gates each formed above one of said channel regions;

said input regions, output regions, and gates being arranged generally in the following sequence as seen from above the integrated circuit device: a first input region, a first gate, a first conductive region, a second gate, a first output region, a third gate, a second conductive region, a fourth gate, a second input region, a fifth gate, a third conductive region, a sixth gate, and a second output region.

7. The multiplexer layout of claim 6, wherein said second gate and said third gate are connected.

8. The multiplexer layout of claim 7, wherein said second gate and said third gate are connected through a polysilicon layer.

9. The multiplexer layout of claim 6, wherein at least two of said plurality of gates are connected.

10. The multiplexer layout of claim 9, wherein at least two of said plurality of gates are connected through a polysilicon layer.

* * * * *